US007887628B2

(12) United States Patent
Scarsbrook et al.

(10) Patent No.: US 7,887,628 B2
(45) Date of Patent: Feb. 15, 2011

(54) THICK SINGLE CRYSTAL DIAMOND LAYER METHOD FOR MAKING IT AND GEMSTONES PRODUCED FROM THE LAYER

(75) Inventors: Geoffrey Alan Scarsbrook, Ascot (GB); Philip Maurice Martineau, Littlewick Green (GB); Barbel Susanne Charlotte Dorn, Bracknell (GB); Michael Andrew Cooper, Wokingham (GB); John Lloyd Collins, London (GB); Andrew John Whitehead, Surrey (GB); Daniel James Twitchen, Sunningdale (GB); Ricardo Simon Sussman, Reading (GB)

(73) Assignee: Element Six Technologies (Pty) Ltd, Johannesburg (ZA)

( * ) Notice: Subject to any disclaimer, the term of this patent is extended or adjusted under 35 U.S.C. 154(b) by 328 days.

(21) Appl. No.: 11/681,840

(22) Filed: Mar. 5, 2007

(65) Prior Publication Data
US 2008/0044339 A1 Feb. 21, 2008

Related U.S. Application Data

(63) Continuation of application No. 11/486,421, filed on Jul. 14, 2006, now abandoned, which is a continuation of application No. 10/739,014, filed on Dec. 19, 2003, now Pat. No. 7,128,974, which is a continuation of application No. 10/297,591, filed as application No. PCT/IB01/01040 on Jun. 14, 2001, now abandoned.

(30) Foreign Application Priority Data

Jun. 15, 2000 (GB) .................................. 0014690.2
Mar. 20, 2001 (GB) .................................. 0106929.3

(51) Int. Cl.
*B32B 9/00* (2006.01)

(52) U.S. Cl. ..................... 106/286.8; 423/446; 427/577; 63/32

(58) Field of Classification Search .............. 106/286.8; 423/446; 472/577; 63/32
See application file for complete search history.

(56) References Cited

U.S. PATENT DOCUMENTS

| 5,127,983 | A | 7/1992 | Iami et al. |
| 5,302,231 | A | 4/1994 | Bovenkerk et al. |
| 5,334,283 | A | 8/1994 | Parikh et al. |

(Continued)

FOREIGN PATENT DOCUMENTS

EP 0 316 856 A1 5/1989

(Continued)

OTHER PUBLICATIONS

JD Hunn et al., "Ion beam and laser-assisted micromachining of single-crystal diamond" Solid State Technology, vol. 37, No. 12, pp. 57-60 (Dec. 1, 1994).

(Continued)

*Primary Examiner*—Archene Turner
(74) *Attorney, Agent, or Firm*—Oblon, Spivak, McClelland, Maier & Neustadt, L.L.P.

(57) ABSTRACT

A layer of single crystal CVD diamond of high quality having a thickness greater than 2 mm. Also provided is a method of producing such a CVD diamond layer.

49 Claims, 10 Drawing Sheets

U.S. PATENT DOCUMENTS

Figure 1:
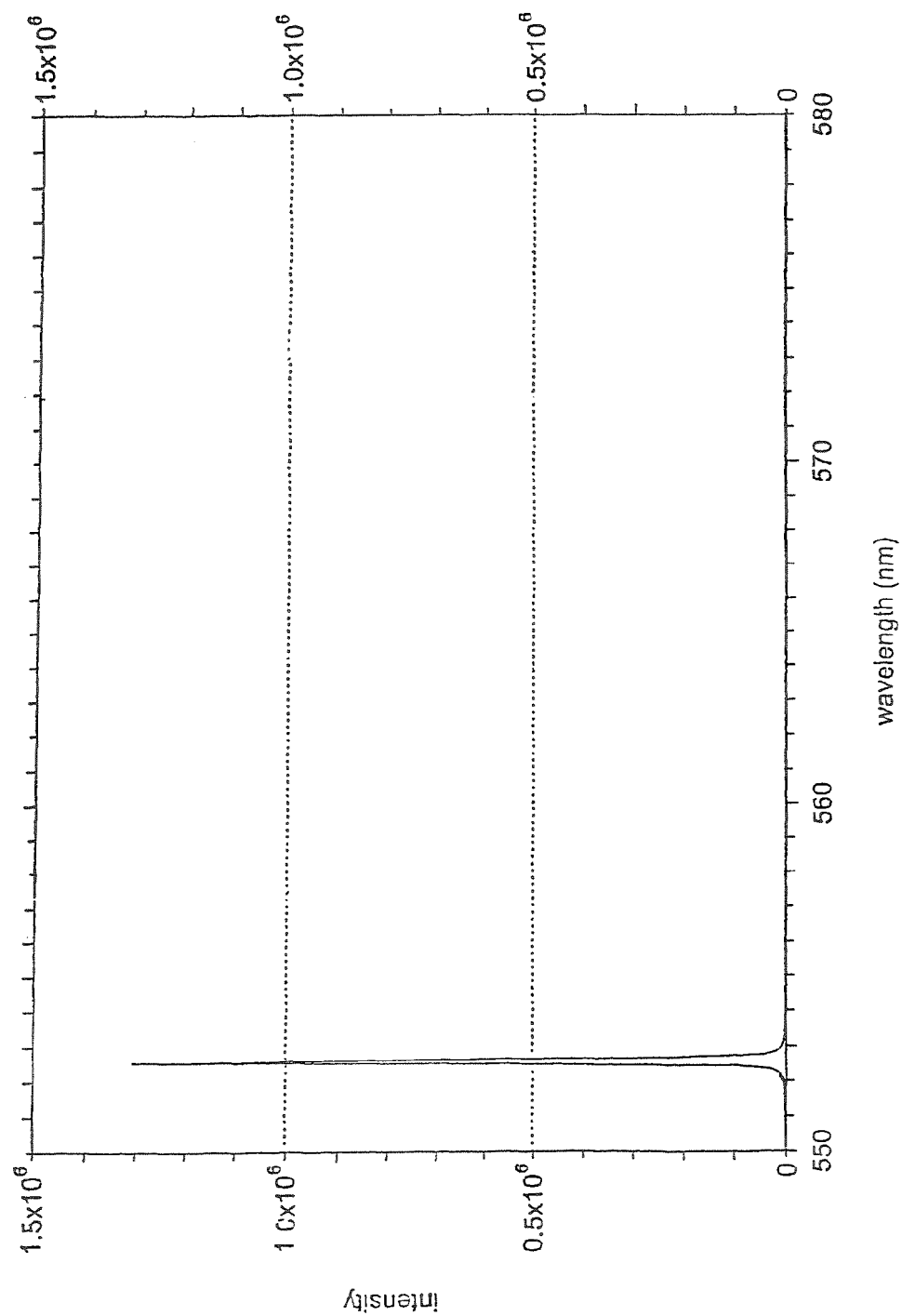

| | | | |
|---|---|---|---|
| 5,360,479 | A | 11/1994 | Banholzer et al. |
| 5,387,310 | A | 2/1995 | Shiomi et al. |
| 5,391,409 | A | 2/1995 | Shibata et al. |
| 5,400,738 | A | 3/1995 | Shiomi et al. |
| 5,419,276 | A | 5/1995 | Anthony et al. |
| 5,443,032 | A | 8/1995 | Vichr et al. |
| 5,474,021 | A | 12/1995 | Tsuno et al. |
| 5,587,210 | A | 12/1996 | Marchywka et al. |
| 5,614,019 | A | 3/1997 | Vichr et al. |
| 5,672,430 | A | 9/1997 | Lu et al. |
| 5,704,976 | A | 1/1998 | Snail |
| 5,773,830 | A | 6/1998 | Lu et al. |
| 5,981,057 | A | 11/1999 | Collins |
| 6,007,916 | A | 12/1999 | Satoh et al. |
| 6,132,816 | A | 10/2000 | Takeuchi et al. |
| 6,582,513 | B1 | 6/2003 | Linares et al. |
| 2004/0175499 | A1 | 9/2004 | Twitchen et al. |
| 2004/0177803 | A1 | 9/2004 | Scarsbrook et al. |
| 2004/0180205 | A1 | 9/2004 | Scarsbrook et al. |
| 2004/0194690 | A1 | 10/2004 | Twitchen et al. |
| 2004/0221795 | A1 | 11/2004 | Scarsbrook et al. |
| 2004/0229464 | A1 | 11/2004 | Godfried et al. |

FOREIGN PATENT DOCUMENTS

| | | |
|---|---|---|
| EP | 0 507 497 | 10/1992 |
| EP | 0 582 397 | 2/1994 |
| EP | 0 589 464 A1 | 3/1994 |
| EP | 0 615 954 A1 | 9/1994 |
| EP | 0 688 026 A1 | 12/1995 |
| EP | 0 715 885 A2 | 6/1996 |
| EP | 0 879 904 | 11/1998 |
| EP | 0 918 100 | 5/1999 |
| JP | 1-131014 | 5/1989 |
| JP | 6-107494 | 4/1994 |
| JP | 6-263418 | 9/1994 |
| JP | 7-277890 | 10/1995 |
| JP | 9-165295 | 6/1997 |
| JP | 11-1392 | 1/1999 |
| JP | 2-107596 | 4/1999 |

OTHER PUBLICATIONS

MA Plano et al., Characterization of a thick homoepitaxial CVD diamond film: Diamond, Sic and Nitrice Wide Bandgap Semiconductors. Symposium, Diamond, Sic and Nitride WiDE Bandgap Semiconductors, pp. 307-312, San Francisco, CA, Apr.-Aug. 1994.

TS McCauley et al., "Homoepitaxial diamond film deposition on a brilliant cut diamond anvil" Applied Physics Letters, vol. 66, No. 12, pp. 1486-1488 (Mar. 20, 1995).

JD Hunn et al., "Fabrication of single-crystal diamond microcomponents" Appl. Phys. Lett, vol. 65, No. 24, pp. 3072-3074 (Dec. 12, 1994).

R Samlenski et al., "Incorporation of nitrogen in chemical vapor deposition diamon", Appl. Phys. Lett, vol. 67, No. 19, pp. 2798-2800 (Nov. 6, 1995).

JN Schauer at al., "Phosphorus incorporation in plasma deposited diamond films", Appl. Phys. Lett, vol. 64, No. 9, pp. 1094-1096 (Feb. 28, 1994).

U.S. Appl. No. 10/311,215, filed Dec. 16, 2002, Scarsbrook et al.

U.S. Appl. No. 12/245,002, filed Oct. 3, 2008, Scarsbrook et al.

P. Kania, et al., Diamond and Related Materials, vol. 4, pp. 425-428 (1995).

English translation of "Characterization of thick homoepitaxial film on diamond (001) substrate II", 1995.

English translation of "Homoepitaxial growth of diamond (001) with nitrogen doping", 1995.

J. Michler, et al., J. Appl. Phys., vol. 83, No. 1, pp. 187-197 (1998).

R. Locher, et al., Appl. Phys. Lett., vol. 65, No. 1, pp. 34-36 (1994).

I.I. Vlasov, et al., Phys. Stat. Sol, vol. (a)181, No. 83, pp. 83-90 (2000).

P.E. Pehrsson, et al., Mat. Res. Soc. Symp, Proc., vol. 416, pp. 51-56 (1996).

THICK SINGLE CRYSTAL DIAMOND LAYER METHOD FOR MAKING IT AND GEMSTONES PRODUCED FROM THE LAYER

This is a continuation application of U.S. application Ser. No. 11/486,421, filed Jul. 14, 2006, which is a continuation application of U.S. application Ser. No. 10/739,014, filed Dec. 19, 2003, which is a continuation of U.S. application Ser. No. 10/297,591, filed Dec. 13, 2002, abandoned, which is a 371 of PCT/IB01/01040 filed on Jun. 14, 2001.

BACKGROUND OF THE INVENTION

This invention relates to diamond and more particularly to diamond produced by chemical vapour deposition (hereinafter referred to as CVD).

Methods of depositing materials such as diamond on a substrate by CVD are now well established and have been described extensively in the patent and other literature. Where diamond is being deposited on a substrate, the method generally involves providing a gas mixture which, on dissociation, can provide hydrogen or a halogen (e.g. F,Cl) in atomic form and C or carbon-containing radicals and other reactive species, e.g. $CH_x$, $CF_x$ wherein x can be 1 to 4. In addition, oxygen-containing sources may be present, as may sources for nitrogen, and for boron. In many processes inert gases such as helium, neon or argon are also present. Thus, a typical source gas mixture will contain hydrocarbons $C_xH_y$ wherein x and y can each be 1 to 10 or halocarbons $C_xH_yHal_z$ (Hal=halogen) wherein x and z can each be 1 to 10 and y can be 0 to 10 and optionally one or more of the following: $CO_x$, wherein x can be 0.5 to 2, $O_2$, $H_2$, $N_2$, $NH_3$, $B_2H_6$ and an inert gas. Each gas may be present in its natural isotopic ratio, or the relative isotopic ratios may be artificially controlled; for example hydrogen may be present as deuterium or tritium, and carbon may be present as $^{12}C$ or $^{13}C$. Dissociation of the source gas mixture is brought about by an energy source such as microwaves, RF energy, a flame, a hot filament, or a jet based technique and the reactive gas species so produced are allowed to deposit onto a substrate and form diamond.

CVD diamond may be produced on a variety of substrates. Depending on the nature of the substrate and details of the process chemistry, polycrystalline or single crystal CVD diamond may be produced. The production of homoepitaxial CVD diamond layers has been reported in the literature. Prior art has generally concerned itself with the thermal, optical and mechanical properties of CVD diamond.

SUMMARY OF THE INVENTION

According to a first aspect of the invention, there is provided a layer of single crystal CVD diamond of high quality having a thickness of at least 2 mm, and preferably a thickness of greater than 2.5 mm, and more preferably a thickness of greater than 3 mm.

The high quality of the diamond may be characterised by one or more of the following characteristics. These characteristics are observable in the majority volume of the layer or stone or in the {100} growth sector when present and discernible:

1) A high charge collection distance of at least 100 μm, preferably at least 150 μm, and more preferably at least 400 μm, all collection distances being measured at an applied field of 1 V/μm and at 300 K (or 20° C., which for the purposes of this invention is considered equivalent). In high quality type IIa natural diamond charge collection distances are reported to be substantially less than 100 μm, and more typically about 40 μm at an applied field of 1 V/μm.

2) A high value for the product of the average carrier mobility and lifetime μτ, such that it exceeds $1.0 \times 10^{-6}$-$cm^2/V$, and preferably exceeds $1.5 \times 10^{-6}$ $cm^2/N$, and more preferably exceeds $4 \times 10^{-6}$ $cm^2/N$, all measurements at 300 K.

3) In the off state, a resistivity measured at 300 K greater than $10^{12}$ Ωcm at an applied field of 50 V/μm, and preferably greater than $2 \times 10^{13}$ Ωcm, and more preferably greater than $5 \times 10^{14}$ Ωcm.

In a wide band gap device such as one fabricated from diamond, the number of free charge carriers present under equilibrium conditions is extremely small and dominated by the contribution from lattice defects and impurities, such a device is said to be in the "off state". The device can be put into the "on state" by the additional excitation of charge carriers by means such as optical excitation (primarily using optical energies near or greater than the band gap) or by charged particle excitation (e.g. alpha or beta particles). In the on state the free carrier density exceeds the equilibrium level and when the excitation source is removed the device will revert to the off state.

4) An electron mobility ($\mu_e$) measured at 300 K greater than 2400 $cm^2V^{-1}s^{-1}$, and preferably greater than 3000 $cm^2V^{-1}s^{-1}$, and more preferably greater than 4000 $cm^2V^{-1}s^{-1}$. In high quality type IIa natural diamond electron mobilities are reported typically to be 1800 $cm^2V^{-1}s^{-1}$ at 300 K with exceptional values reported up to 2200 $cm^2V^{-1}s^{-1}$.

5) A hole mobility ($\mu_h$) measured at 300 K greater than 2100 $cm^2V^{-1}s^{-1}$, and preferably greater than 2500 $cm^2V^{-1}s^{-1}$, and more preferably greater than 3000 $cm^2V^{-1}s^{-1}$. In high quality type IIa natural diamond hole mobilities are reported to be typically 1200 $cm^2V^{-1}s^{-1}$ at 300 K with exceptional values reported up to 1900 $cm^2V^{-1}s^{-1}$.

It will be noted from the above that the diamond of the invention has electronic characteristics which are significantly superior to those present in natural high quality diamond. This is surprising and provides the diamond with properties which are useful, for example, for electronic applications where thick layers are required and also for the economic production of thinner layers for other electronic devices. There is benefit in synthesising a single thick layer and processing it into multiple thinner layers because of the reduced overheads in terms of substrates and synthesis preparation.

The diamond of the invention is also suitable for use as diamond anvils in high pressure experiments and manufacture where the low defect density of the diamond makes it much stronger than natural diamond and able to operate under more extreme conditions of temperature and pressure.

The diamond of the invention has a thickness suitable to allow for the production through cutting, for example, of one or more gemstones therefrom.

In addition to the characteristics described above, the diamond layer of the invention may have one or more of the following characteristics:

1) A level of any single impurity of not greater than 5 ppm and a total impurity content of not greater than 10 ppm. Preferably the level of any impurity is not greater than 0.5 to 1 ppm and the total impurity content is not greater than 2 to 5 ppm. Impurity concentrations can be measured by secondary ion mass spectroscopy (SIMS), glow discharge mass spectroscopy (GDMS) or combustion mass spectroscopy (CMS), electron paramagnetic resonance (EPR) and IR (infrared) absorption, and in addition for single substitutional nitrogen by optical absorption measurements at 270 nm (calibrated against standard values obtained from samples destructively analysed by combustion analysis). In the above, "impurity" excludes hydrogen and its isotopic forms.

2) A cathodoluminescence (CL) line at 575 nm which is low or absent, and associated photoluminescence (PL), measured at 77 K under 514 nm Ar ion laser excitation (nominally 300 mW incident beam) which has a peak height<1/25 and preferably <1/300 and more preferably <1/1000 of the diamond Raman peak at 1332 cm$^{-1}$. These bands are related to nitrogen/vacancy defects and their presence indicates the presence of nitrogen in the film. Due to the possible presence of competing quenching mechanisms, the normalised intensity of the 575 nm line is not a quantitative measure of nitrogen nor is its absence a definitive indication of the absence of nitrogen in the film. CL is the luminescence resulting from excitation by electron beam at a typical beam energy of 10 to 40 keV which penetrates about 10 microns into the sample surface. Photoluminescence is more generally excited through the sample volume.

3)
(i) Strong free exciton (FE) emission in the cathodoluminescence spectrum collected at 77 K.

Free exciton emission is quenched by point defects and structural defects such as dislocations. The presence of strong free exciton emission in the cathodoluminescence spectrum indicates the substantial absence of dislocations and impurities. The link between low defect and impurity densities and high FE emission intensity has previously been reported for individual crystals in polycrystalline CVD diamond synthesis.

(ii) Strong free exciton emission in the room temperature UV-excited (ultra violet-excited) photoluminescence spectrum.

Free exciton emission can also be excited by above-bandgap radiation, for example by 193 nm radiation from an ArF excimer laser. The presence of strong free exciton emission in the photoluminescence spectrum excited in this way indicates the substantial absence of dislocations and impurities. The strength of free exciton emission excited by 193 nm ArF excimer laser at room temperature is such that the quantum yield for free exciton emission is at least $10^{-5}$.

4) In electron paramagnetic resonance (EPR), a single substitutional nitrogen centre [N—C]$^0$ at a concentration<100 ppb and typically <40 ppb and more typically <20 ppb indicating low levels of nitrogen.

5) In EPR, a spin density<$1\times10^{17}$ cm$^{-3}$ and more typically <$5\times10^{16}$ cm$^{-3}$ at g=2.0028. In single crystal diamond this line is related to lattice defect concentrations and is typically large in natural type IIa diamond, in CVD diamond plastically deformed through indentation, and in poor quality homoepitaxial diamond.

6) Excellent optical properties having a UV/Visible and IR (infra-red) transparency close to the theoretical maximum for diamond and, more particularly, low or absent single substitutional nitrogen absorption at 270 nm in the UV, and low or absent C-H stretch absorption in the spectral range 2500 to 3400 cm$^{-1}$ in the IR.

The characteristics described above will be observable in the majority volume of the layer or stone. There may be portions of the volume, generally less than 10 percent by volume, where the particular characteristic is not observable.

The invention provides, according to another aspect, a synthetic diamond in the form of a gemstone produced from a layer of the type described above.

The novel thick single crystal CVD diamond layer of the invention may be made by a method which forms yet another aspect of the invention. This method includes the steps of providing a diamond substrate having a surface substantially free of crystal defects, providing a source gas, dissociating the source gas and allowing homoepitaxial diamond growth on the surface of low defect level to occur in an atmosphere which contains less than 300 parts per billion nitrogen. It has been found that thick single crystal CVD diamond layers of high quality may be produced if a diamond substrate having a surface substantially free of crystal defects is used and if the homoepitaxial growth occurs in an atmosphere which contains less than 300 parts per billion molecular nitrogen.

The importance of achieving a substrate surface substantially free of surface defects on which to synthesise thick layers is that such defects cause dislocations and associated defects in the overgrown CVD layer, and that once present these dislocation structures cannot simply terminate in the layer but generally multiply and expand, resulting in stress, defects and cracks as the layer is grown thicker. Nitrogen in the process, even at very low levels, plays a role in controlling the morphology of the growing surface, resulting in stepped growth which again causes dislocated and defective growth as the layer increases in thickness.

The invention further provides a CVD diamond produced from a single crystal CVD layer described above polished in the form of a gemstone characterised by having three orthogonal dimensions greater than 2 mm, and preferably greater than 2.5 mm, and more preferably greater than 3.0 mm, where at least one axis lies either along the <100> crystal direction or along the principle symmetry axis of the stone. The diamond will be of high quality and may have one or more of the characteristics identified above.

DESCRIPTION OF EMBODIMENTS

The single crystal CVD diamond layer of the invention has a thickness of at least 2 mm and is of high quality, and particularly is of high crystalline perfection and purity. This is evidenced by the diamond having one or more of the characteristics identified above.

The collection distance may be determined by methods known in the art. The collection distances referred to in this specification were determined by the following procedure:

1) Ohmic spot contacts are placed on either side of the layer under test. This layer is typically 300-700 µm thick and 5-10 mm square, allowing spot contacts of 2-6 mm diameter. Formation of ohmic contacts (rather than contacts showing diode behaviour) is important for a reliable measurement. This can be achieved in several ways but typically the procedure is as follows:

i) the surface of the diamond is oxygen terminated, using for example, an oxygen plasma ash, minimising the surface electrical conduction (reducing the 'dark current' of the device);

ii) a metallisation consisting of first a carbide former (e.g. Ti, Cr) and then a thicker layer of protective material, typically Au (to which a wire bond can be made), is deposited onto the diamond by sputtering, evaporation or similar method. The contact is then typically annealed between 400-600° C. for about an hour.

2) Wire bonds to the contacts are made, and the diamond connected in a circuit, with a bias voltage of typically 2-10 kV/cm. The 'dark current' or leakage current is characterised, and in a good sample should be less than 5 nA, and more typically less than 100 pA at 2.5 kV/cm.

3) The collection distance measurement is made by exposing the sample to beta radiation, with a Si trigger detector on the exit face to a) indicate that an event has occurred, and b) ensure that the beta particle was not stopped within the diamond film which would result in a much larger number of charge carriers being formed. The signal from the diamond is then read by a high gain charge amplifier, and, based on the known formation rate of charge carriers of about 36 electron/hole pairs per linear μm traversed by the beta particle, the collection distance can be calculated from the charge measured by the equation:

$$CCD = CCE \times t$$

where t=sample thickness
CCE=charge collection efficiency=charge collected/total charge generated.
CCD=charge collection distance.
It is clear that the charge collection distance measured is limited to the sample thickness; this is expressed in the Hecht relationship given later.

4) For completeness, the collection distance is measured for a range of values of applied bias voltage, both forward and reverse, and the characteristic collection distance quoted at bias voltages of 10 kV/cm only for samples which show a well behaved linear behaviour for bias voltages up to 10 kV/cm bias. In addition, the entire measurement procedure is repeated several times to ensure repeatability of behaviour, as values measured on poorer samples can degrade with time and treatment history.

5) A further issue in measurement of the collection distance is whether the material is in the pumped or unpumped state. 'Pumping' (also called 'priming') the material comprises of exposing it to certain types of radiation (beta, gamma etc.) for a sufficient period, when the collection distance measured can rise, typically by a factor of 1.6 in polycrystalline CVD diamond although this can vary. The effect of priming is generally lower in high purity single crystal diamond; priming by factors of 1.05-1.2 is common with no measurable priming in some samples. De-pumping can be achieved by exposing to sufficiently strong white light or light of selected wavelengths, and the process is believed to be wholly reversible. The collection distances referred to in this specification are all in the unpumped state whatever the final application of the material. In certain applications (e.g. high energy particle physics experiments), the increase in collection distance associated with pumping can be used beneficially to enhance the detectability of individual events, by shielding the detector from any de-pumping radiation. In other applications, the instability in device gain associated with pumping is severely deleterious.

The single crystal CVD diamond of the invention may, in one form of the invention, have, in the off state, a high resistivity at high applied fields and more particularly a resistivity $R_1$ exceeding $1 \times 10^{12}$ Ωcm, and preferably exceeding $2 \times 10^{13}$ Ωcm and more preferably exceeding $5 \times 10^{14}$ Ωcm, at an applied field of 50 V/μm measured at 300 K. Such resistivities at such high applied fields are indicative of the purity of the diamond and the substantial absence of impurities and defects. Material of lower purity or crystal perfection can exhibit high resistivity at lower applied fields, e.g. <30 V/μm, but shows breakdown behaviour with rapidly rising leakage currents at applied fields greater than 30 V/μm and generally by 45 V/μm. The resistivity can be determined from a measurement of the leakage (dark) current by methods known in the art. A sample under test is prepared as a plate of uniform thickness, cleaned using standard diamond cleaning techniques in order to accept suitable contacts (evaporated, sputtered or doped diamond) to which external connections can be made to the voltage supply, and then partially or wholly encapsulated to minimise risk of flash-over. It is important to ensure that the encapsulation does not add significantly to the leakage current measured. Typical sample sizes are 0.01-0.5 mm thick by 3×3 mm-50×50 mm laterally, but smaller or larger sizes may also be used.

The single crystal CVD diamond of the invention may have a μτ product greater than $1.0 \times 10^{-6}$ cm$^2$/V, preferably a μτ product of greater than $1.5 \times 10^{-6}$ cm$^2$/V and more preferably a μτ product greater than $4.0 \times 10^{-6}$ cm$^2$/V. The μτ product is related to the charge collection distance using the following equation:

$$\mu\tau E = CCD$$

$$(\mathrm{cm}^2/\mathrm{Vs}) \times (s) \times (\mathrm{V/cm}) = \mathrm{cm}$$

where E=applied field

The single crystal CVD diamond of the invention, particularly in its preferred form, has a high μτ product which translates into a high charge collection distance.

When an electric field is applied to a sample using electrodes it is possible to separate the electron-hole pairs generated by photon irradiation of the sample. The holes drift toward the cathode and the electrons toward the anode. Light with a short wavelength (UV light) and a photon energy above the bandgap of the diamond has a very small penetration depth into the diamond and by using this type of light it is possible to identify the contribution of one type of carrier only dependent on which electrode is illuminated.

The μτ product referred to in this specification is measured in the following way:

(i) A sample of diamond is prepared as a plate in excess of ≈100 μm thick.

(ii) Ti semi-transparent contacts are sputtered onto both sides of the diamond plate and then patterned using standard photolithography techniques. This process forms suitable contacts.

(iii) A 10 μs pulse of monochromatic Xe light (wavelength 218 nm) is used to excite carriers, with the photocurrent generated being measured in an external circuit. The pulse length of 10 μs is far longer than other processes such as the transit time and the carrier lifetime and the system can be considered to be in equilibrium at all times during the pulse. The penetration of light into the diamond at this wavelength is only a few microns. Relatively low light intensity is used (about 0.1 W/cm$^2$), so that the total number of electron hole pairs generated by the light pulse is relatively low and the internal field is then reasonably approximated by the applied field. The applied field is kept below the threshold above which mobility becomes field dependent. The applied field is also kept below the value above which a significant proportion of the charge carriers reach the far side of the diamond and the total charge collected shows saturation (with blocking contacts; non-blocking contacts can show gain at this point).

(iv) The μτ product is derived by relating the collected charge to the applied voltage using the Hecht relation.

$$Q = N_0 e \mu \tau E / D [1 - \exp\{-D/(\mu\tau E)\}]$$

In this equation Q is the charge collected at the non-illuminated contact, $N_0$ the total number of electron hole pairs generated by the light pulse, E the applied electric field, D the sample thickness, and μτ is the mobility and lifetime product to be determined.

(v) As an example, if the illuminated electrode is the anode (cathode), then the charge carriers are generated within a few μm of the surface, and the charge displacement of the electrons (holes) to the nearby electrode is negligible. In contrast, the charge displacement of the holes (electrons) towards the opposing contact is significant, and limited by the μτ product, where both μ and τ are specific to the particular charge carriers moving towards the non-irradiated electrode.

The CVD diamond layer of the invention may be attached to a diamond substrate (whether the substrate is synthetic, natural, or CVD diamond). Advantages of this approach include providing a greater overall thickness where the thickness limits the application, or providing support for a CVD layer whose thickness has been reduced by processing. In addition, the CVD diamond layer of this invention may form one layer in a multilayer device, where other diamond layers may, for example, be doped to provide electrical contact or electronic junctions to the diamond layer, or merely be present to provide support for the diamond layer.

It is important for the production of thick high quality single crystal CVD diamond layers that growth takes place on a diamond surface which is substantially free of crystal defects. In this context, defects primarily means dislocations, other crystal defects and microcracks, but also includes twin boundaries, point defects, low angle boundaries and any other disruption to the crystal lattice. Preferably the substrate is a low birefringence type Ia or IIb natural, a Ib or IIa high pressure/high temperature synthetic diamond or a CVD synthesised single crystal diamond.

The defect density is most easily characterised by optical evaluation after using a plasma or chemical etch optimised to reveal the defects (referred to as a revealing plasma etch), using for example a brief plasma etch of the type described below. Two types of defects can be revealed:

1) Those intrinsic to the substrate material quality. In selected natural diamond the density of these defects can be as low as $50/mm^2$ with more typical values being $10^2/mm^2$, whilst in others it can be $10^6/mm^2$ or greater.

2) Those resulting from polishing, including dislocation structures and microcracks in the form of 'chatter tracks' along polishing lines. The density of these can vary considerably over a sample, with typical values ranging from about $10^2/mm^2$, up to more than $10^4/mm^2$ in poorly polished regions or samples.

The preferred low density of defects is thus such that the density of surface etch features related to defects, as described above, is below $5 \times 10^3/mm^2$, and more preferably below $10^2/mm^2$.

The defect level at and below the substrate surface on which the CVD growth takes place may thus be minimised by careful preparation of the substrate. Here preparation includes any process applied to the material from mine recovery (in the case of natural diamond) or synthesis (in the case of synthetic material) as each stage can influence the defect density within the material at the plane which will ultimately form the substrate surface when processing to form a substrate is complete. Particular processing steps may include conventional diamond processes such as mechanical sawing, lapping and polishing conditions, and less conventional techniques such as laser processing or ion implantation and lift off techniques, chemical/mechanical polishing, and both liquid and plasma chemical processing techniques. In addition, the surface $R_A$ (arithmetic mean of the absolute deviation of surface profile measured by stylus profilometer, preferably over 0.08 mm length) should be minimised, typical values prior to any plasma etch being a few nanometers, i.e. less than 10 nm.

One specific method of minimising the surface damage of the substrate, is to include an in situ plasma etch on the surface on which the homoepitaxial diamond growth is to occur. In principle this etch need not be in situ, nor immediately prior to the growth process, but the greatest benefit is achieved if it is in situ, because it avoids any risk of further physical damage or chemical contamination. An in situ etch is also generally most convenient when the growth process is also plasma based. The plasma etch can use similar conditions to the deposition or diamond growing process, but with the absence of any carbon containing source gas and generally at a slightly lower temperature to give better control of the etch rate. For example, it can consist of one or more of:

(i) an oxygen etch using predominantly hydrogen with optionally a small amount of Ar and a required small amount of $O_2$. Typical oxygen etch conditions are pressures of $50\text{-}450 \times 10^2$ Pa, an etching gas containing an oxygen content of 1 to 4 percent, an argon content of 0 to 30 percent and the balance hydrogen, all percentages being by volume, with a substrate temperature 600-1100° C. (more typically 800° C.) and a typical duration of 3-60 minutes.

(ii) a hydrogen etch which is similar to (i) but where the oxygen is absent.

(iii) alternative methods for the etch not solely based on argon, hydrogen and oxygen may be used, for example, those utilising halogens, other inert gases or nitrogen.

Typically the etch consists of an oxygen etch followed by a hydrogen etch and then moving directly into synthesis by the introduction of the carbon source gas. The etch time/temperature is selected to enable any remaining surface damage from processing to be removed, and for any surface contaminants to be removed, but without forming a highly roughened surface and without etching extensively along extended defects (such as dislocations) which intersect the surface and thus causing deep pits. As the etch is aggressive, it is particularly important for this stage that the chamber design and material selection for its components be such that no chamber material is transferred by the plasma into the gas phase or to the substrate surface. The hydrogen etch following the oxygen etch is less specific to crystal defects rounding off the angularities caused by the oxygen etch (which aggressively attacks such defects) and provides a smoother, better surface for subsequent growth.

The surface or surfaces of the diamond substrate on which the CVD diamond growth occurs are preferably the {100}, {110}, {113} or {111} surfaces. Due to processing constraints, the actual sample surface orientation can differ from these orientations by up to 5°, and in some cases up to 100, although this is less desirable as it adversely affects reproducibility.

It is also important in the method of the invention that the impurity content of the environment in which the CVD growth takes place is properly controlled. More particularly, the diamond growth must take place in the presence of an atmosphere containing substantially no nitrogen, i.e. less than 300 parts per billion (ppb, as a molecular fraction of the total gas volume), and preferably less than 100 parts per billion. The role of nitrogen in the synthesis of CVD diamond, particularly polycrystalline CVD diamond, has been reported in the literature. For example, it has been noted in these reports that gas phase nitrogen levels of 10 parts per million or greater modify the relative growth rates between the {100} and the {111} faces with an overall increase in growth rate, and in some cases quality. Further, it has been suggested that for certain CVD diamond synthesis processes, low nitrogen contents of below a few parts per million may be used. However, none of these reported processes disclose methods of nitrogen analysis which are sufficiently sensitive to ensure that the nitrogen content is substantially below 1 part per million, and in the region of 300 or less parts per billion. Measurement of nitrogen levels of these low values requires sophisticated monitoring such as that which can be achieved, for example, by gas chromotography. An example of such a method is now described:

(1) Standard gas chromatography (GC) art consists of: A gas sample stream is extracted from the point of interest using a narrow bore sample line, optimised for maximum flow velocity and minimum dead volume, and passed through the GC sampling coil before being passed to waste. The GC sample coil is a section of tube coiled up with a fixed and known volume (typically 1 cm$^3$ for standard atmospheric pressure injection) which can be switched from its location in the sample line into the carrier gas (high purity He) line feeding into the gas chromatography columns. This places a sample of gas of known volume into the gas flow entering the column; in the art, this procedure is called sample injection.

The injected sample is carried by the carrier gas through the first GC column (filled with a molecular sieve optimised for separation of simple inorganic gases) and is partially separated, but the high concentration of primary gases (e.g. $H_2$, Ar) causes column saturation which makes complete separation of the nitrogen difficult. The relevant section of the effluent from the first column is then switched into the feed of a second column, thereby avoiding the majority of the other gases being passed into the second column, avoiding column saturation and enabling complete separation of the target gas ($N_2$). This procedure is called "heart-cutting".

The output flow of the second column is put through a discharge ionisation detector (DID), which detects the increase in leakage current through the carrier gas caused by the presence of the sample. Chemical identity is determined by the gas residence time which is calibrated from standard gas mixtures. The response of the DID is linear over more than 5 orders of magnitude, and is calibrated by use of special calibrated gas mixtures, typically in the range of 10-100 ppm, made by gravimetric analysis and then verified by the supplier. Linearity of the DID can be verified by careful dilution experiments.

(2) This known art of gas chromatography has been further modified and developed for this application as follows: The processes being analysed here are typically operating at 70-500×10$^2$ Pa. Normal GC operation uses the excess pressure over atmospheric pressure of the source gas to drive the gas through the sample line. Here, the sample is driven by attaching a vacuum pump at the waste end of the line and the sample drawn through at below atmospheric pressure. However, whilst the gas is flowing the line impedance can cause significant pressure drop in the line, affecting calibration and sensitivity. Consequently, between the sample coil and the vacuum pump is placed a valve which is shut a short duration before sample injection in order to enable the pressure at the sample coil to stabilise and be measured by a pressure gauge. To ensure a sufficient mass of sample gas is injected, the sample coil volume is enlarged to about 5 cm$^3$. Dependent on the design of the sample line, this technique can operate effectively down to pressures of about 70×10$^2$ Pa. Calibration of the GC is dependent on the mass of sample injected, and the greatest accuracy is obtained by calibrating the GC using the same sample pressure as that available from the source under analysis. Very high standards of vacuum and gas handling practice must be observed to ensure that the measurements are correct.

The point of sampling may be upstream of the synthesis chamber to characterise the incoming gases, within the chamber to characterise the chamber environment, or downstream of the chamber to measure a worst case value of the nitrogen concentration within the chamber.

The source gas may be any known in the art and will contain a carbon-containing material which dissociates producing radicals or other reactive species. The gas mixture will also generally contain gases suitable to provide hydrogen or a halogen in atomic form.

The dissociation of the gas source is preferably carried out using microwave energy in a reactor which may be any known in the art. However, the transfer of any impurities from the reactor should be minimised. A microwave system may be used to ensure that the plasma is placed away from all surfaces except the substrate surface on which diamond growth is to occur and its mount. Examples of preferred mount materials are: molybdenum, tungsten, silicon and silicon carbide. Examples of preferred reactor chamber materials are stainless steel, aluminium, copper, gold, platinum.

A high plasma power density should be used, resulting from high microwave power (typically 3-60 kW, for substrate diameters of 50-150 mm) and high gas pressures (50-500× 10$^2$ Pa, and preferably 100-450×10$^2$ Pa).

Using the preferred conditions described above it has been possible to produce high quality single crystal CVD diamond layers>2 mm thick (e.g. 3.4 mm thick), and to produce from these layers high quality CVD synthetic cut stones in the form of gemstones, in which three orthogonal dimensions exceed 2 mm (e.g. a round brilliant of 0.31 ct, height 2.6 mm, girdle diameter 4.3 mm).

Examples of the invention will now be described.

Example 1

Substrates suitable for synthesising a layer of CVD diamond of the invention may be prepared as follows:
i) Selection of stock material (Ia natural stones and Ib HPHT stones) was optimised on the basis of microscopic investigation and birefringence imaging to identify substrates which were free of strain and imperfections.
ii) Laser sawing, lapping and polishing processes were used to minimise subsurface defects using a method of a revealing plasma etch to determine the defect levels being introduced by the processing.
iii) It was possible routinely to produce substrates in which the density of defects measurable after a revealing etch is dependent primarily on the material quality and is below 5×10$^3$/mm$^2$, and generally below 10$^2$/mm$^2$. Substrates prepared by this process are then used for the subsequent synthesis.

A high temperature/high pressure synthetic Ib diamond was grown in a high pressure press and prepared as a plate using the method described above to minimise subsurface defects. The final plate was 5.8 mm×4.9 mm×1.6 mm thick, with all faces {100}. The surface roughness at this point was less than 1 nm $R_A$. This substrate (substrate 1$a$) was mounted, along with a second, similarly prepared, substrate (substrate 1$b$) on a tungsten substrate using a high temperature braze suitable for diamond. This was introduced into the reactor and an etch and growth cycle commenced as described above, and more particularly:

1) The reactor was pre-fitted with point of use purifiers, reducing nitrogen levels in the incoming gas stream to below 80 ppb, as determined by the modified GC method described above.
2) An in situ oxygen plasma etch was performed using 30/150/1200 sccm (standard cubic centimeter per second) of $O_2/Ar/H_2$ at $237 \times 10^2$ Pa and a substrate temperature of 849° C.
3) This moved without interruption into a hydrogen etch at 830° C. with the removal of the $O_2$ from the gas flow.
4) This moved into the growth process by the addition of the carbon source which in this instance was $CH_4$ at 30 sccm. The growth temperature at this stage was 822° C.
5) The atmosphere in which the growth took place contained less than 100 ppb nitrogen, as determined by the modified GC method described above.
6) On completion of the growth period, the two substrates were removed from the reactor. A CVD layer 3.4 mm thick was released from substrate (1a) and prepared as a cut CVD synthetic in the form of a round brilliant gemstone for experimental purposes using standard gemstone preparation techniques. This cut synthetic stone had a height (table to culet) of 2.62 mm and a weight of 0.31 ct. The CVD layer from substrate (1b) was used to prepare a CVD plate for those elements of characterisation which are difficult to do quantitatively on a round brilliant.
7) The CVD synthesised layers were then further characterised by obtaining the following data provided below and in the attached FIGS. 1 to 5. (The CVD layers are referred to by the reference numbers of the substrates on which they were grown.):
   i) The collection distance of the plate (1b) was measured to be >400 μm.
   ii) The resistivity of plate (1b) at an applied field of 50V/μm exceeded $1 \times 10^{14}$ Ωcm.
   iii) The Raman/photoluminescence spectrum of the cut CVD synthetic stone (1a) at 77 K, excited using argon ion laser light at 514 nm was dominated by the Raman line (FIG. 1). The zero-phonon line at 575 nm was extremely weak and the ratio of its peak intensity to the Raman peak intensity was approximately 1:7800.
   iv) The Raman FWHM line width of the diamond line at 1332 $cm^{-1}$ for the cut CVD synthetic stone (1a) was 1.52 $cm^{-1}$ (measured using 514 nm laser excitation). (FIG. 2).
   v) The CL spectrum recorded at 77 K for the cut CVD synthetic stone (1a) was dominated by extremely strong free exciton emission at 235 nm. (FIG. 3).
   vi) The optical absorption spectrum of the optical plate (1b) showed no extrinsic absorption features and the measured absorbance at 240 nm was limited only by the reflection losses expected for diamond (FIG. 4).
   vii) EPR spectra of the cut CVD synthetic stone (1a) were recorded with a Bruker X-band (9.5 GHz) spectrometer at room temperature. No single substitutional nitrogen could be detected (P1 EPR centre) with a detection limit of 0.014 ppm. At high powers a weak broad line close to g=2.0028 could be observed, setting an upper limit on the spin density of $1.6 \times 10^{15}$ $cm^{-3}$ (FIG. 5).

Example 2

The procedure set out in Example 1 was repeated with the following variation in conditions:

Two substrates were prepared using the method for low subsurface defects as described in Example 1. The substrate (2a) for the cut CVD synthetic stone was 6.8 mm×6.65 mm×0.71 mm thick, with all faces {100}. Again, an additional similar substrate (2b), for preparation of an optical plate, was used.

The oxygen etch was at 780° C. for 30 minutes and a net power of 7.8 kW.

The hydrogen etch was at 795° C. for 30 minutes.

Growth occurred with 32 sccm $CH_4$ added, at a temperature of 840° C.

The atmosphere during growth contained <100 ppb of $N_2$.

On completion of growth the CVD layer from substrate (2a) was 2.75 mm thick. This layer was processed as cut CVD synthetic in the form of a round brilliant gemstone for experimental purposes using conventional gemstone processing techniques. The final cut CVD synthetic stone had a weight of 0.3 ct, and had colour and quality grades equivalent to E and VS1 using the standard diamond grading system.

The cut CVD synthetic stone (2a) and the optical plate (2b) were further characterised by the data provided below and in the attached figures.

Figure 6:
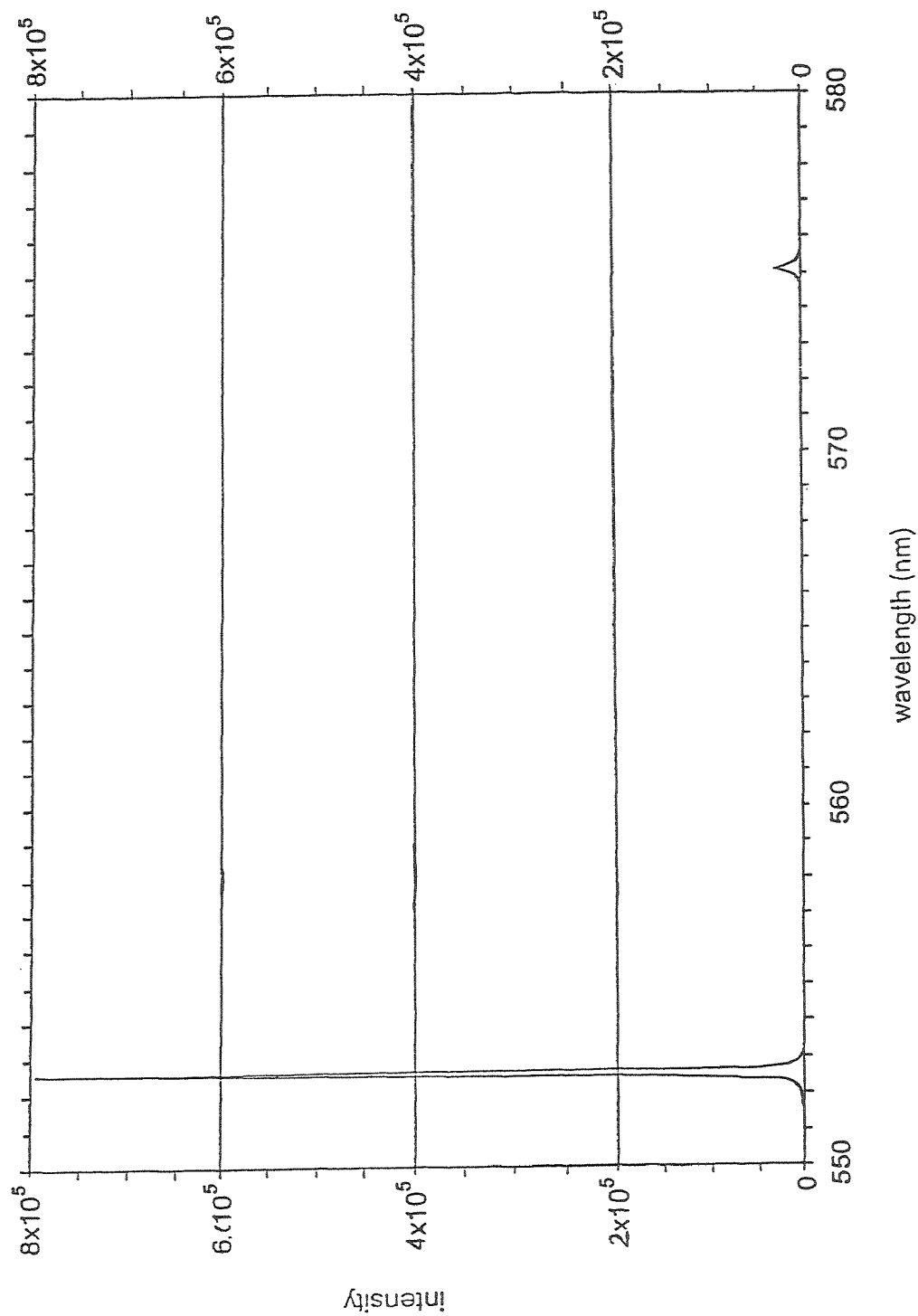
Figure 7:
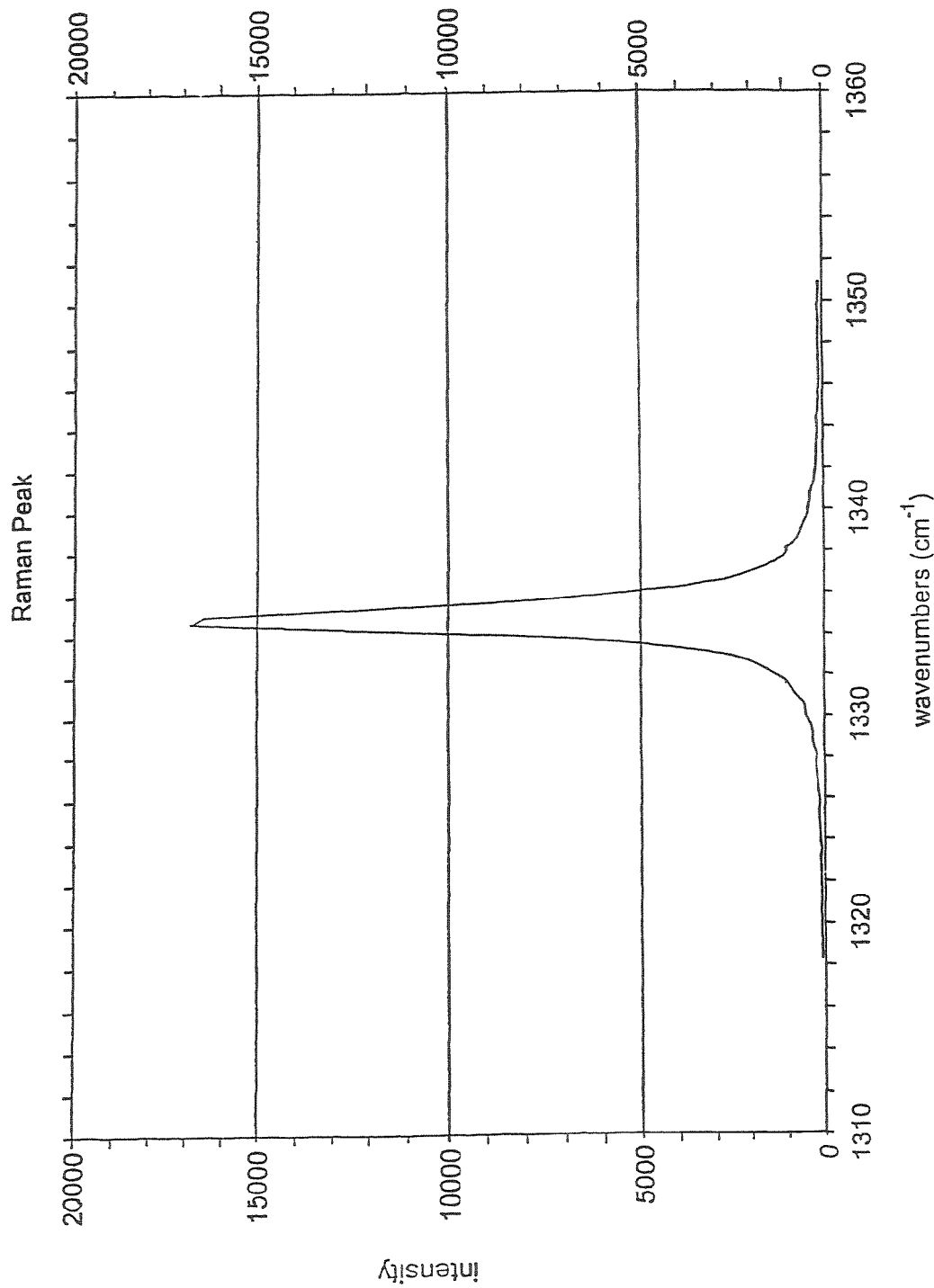
Figure 8:
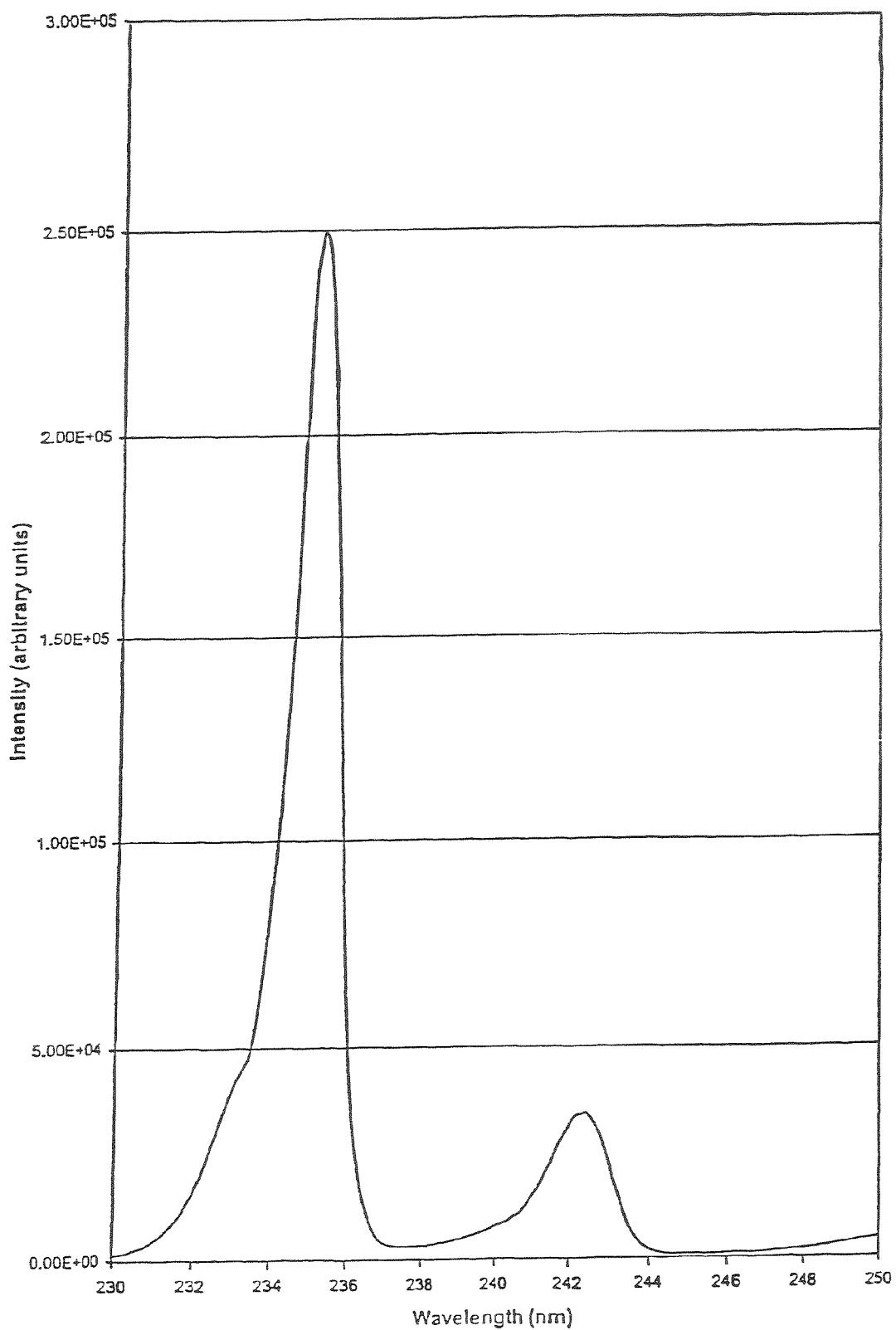
Figure 9:
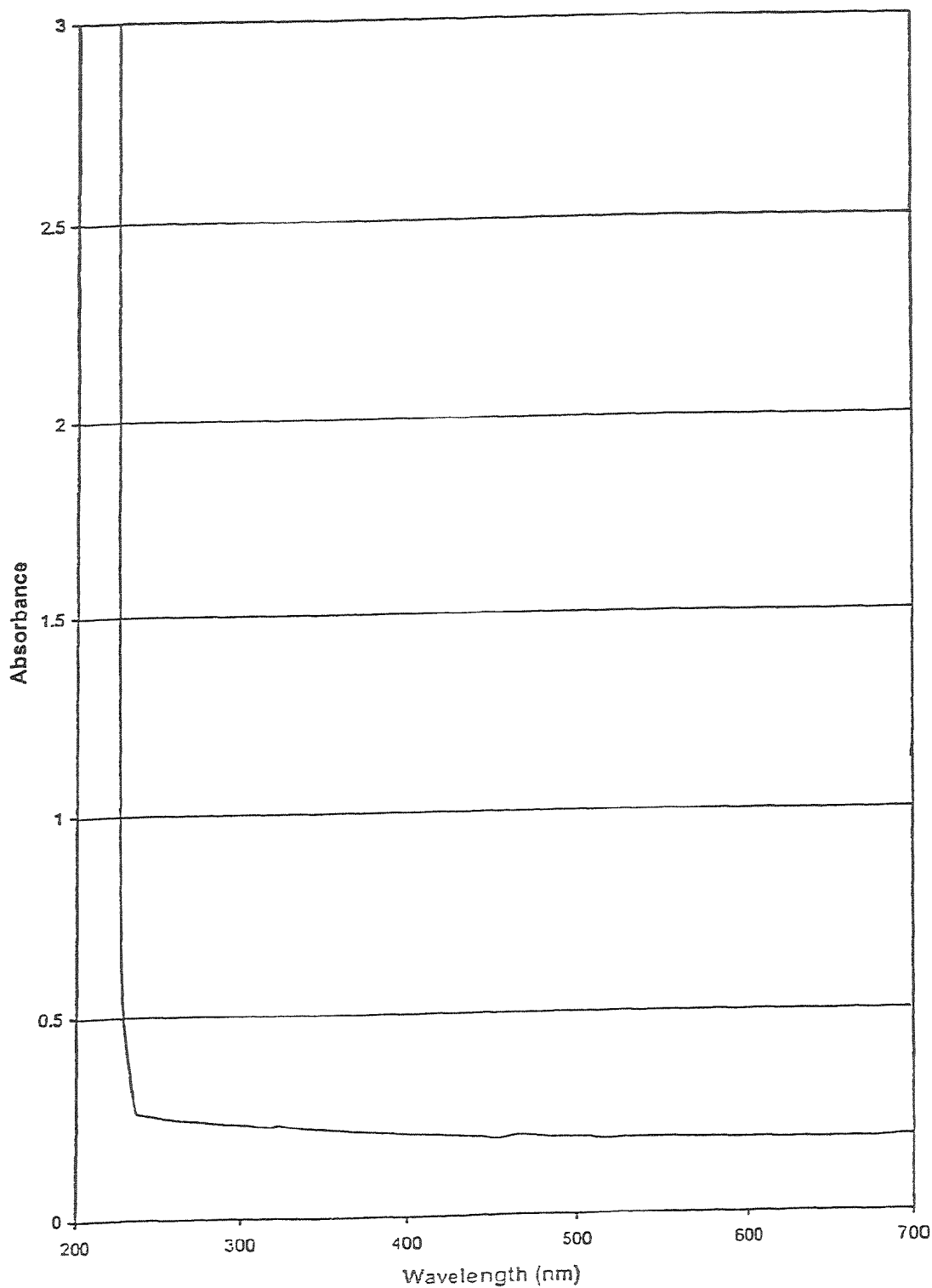
Figure 10:
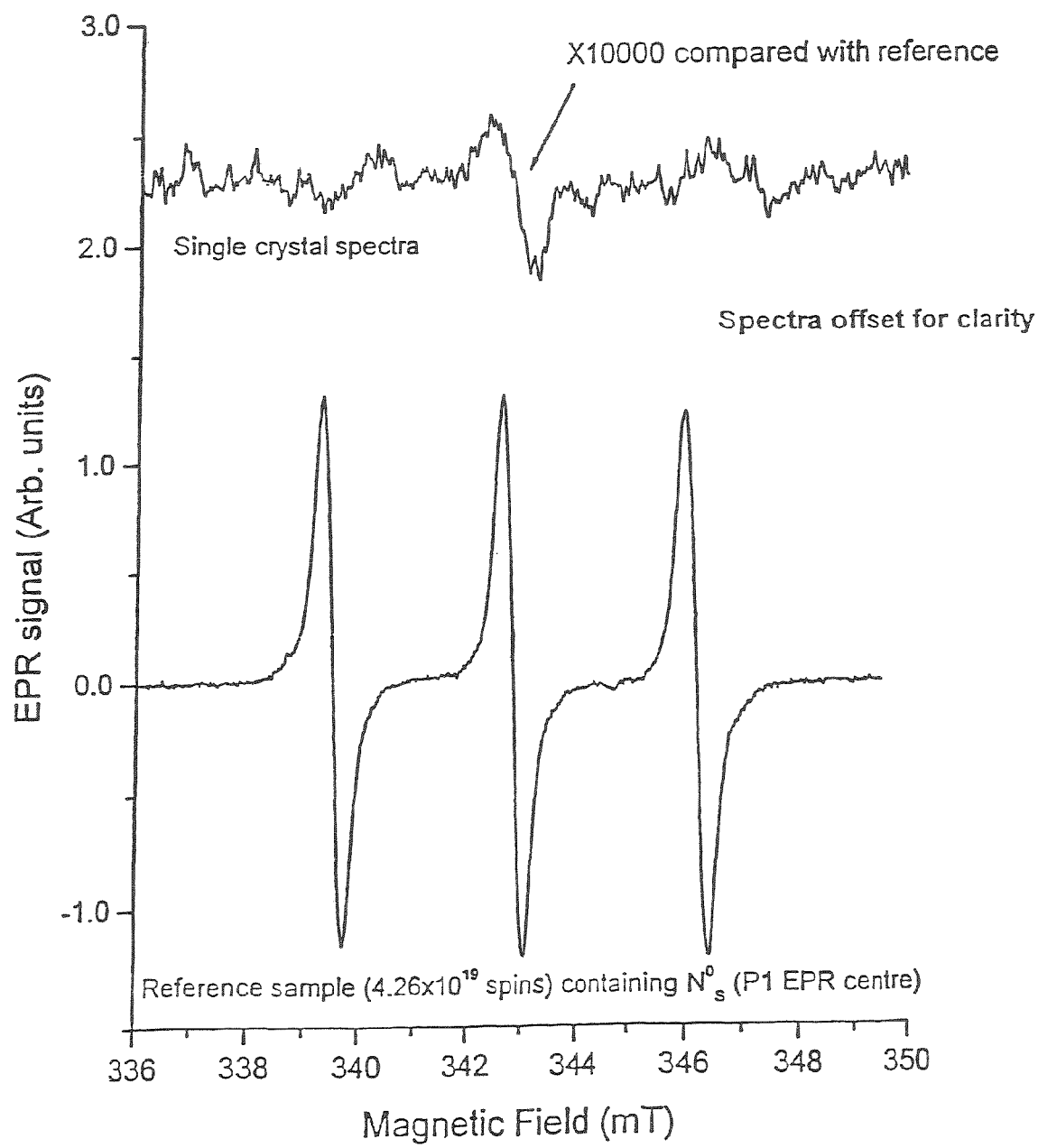

(i) The collection distance of the plate (2b) was measured to be >400 μm.
(ii) The resistivity of plate (2b) at an applied field of 50 V/μm exceeded $1 \times 10^{14}$ Ωcm.
(iii) The Raman/photoluminescence spectrum of the cut CVD synthetic stone (2a) at 77 K, excited using argon ion laser light at 514 nm was dominated by the Raman line (FIG. 6). The zero-phonon line at 575 nm was weak and the ratio of its peak intensity to the Raman peak intensity was approximately 1:28. The Raman line width (FWHM) was 1.54 $cm^{-1}$ (FIG. 7).
(iv) The CL spectrum recorded at 77 K of the cut CVD synthetic stone (2a) was dominated by extremely strong free exciton emission at 235 nm (FIG. 8).
(v) The optical absorption spectrum of the optical plate (2b) showed no extrinsic absorption features and the measured absorbance was limited only by the reflection losses expected for diamond (FIG. 9).
(vi) EPR spectra of the cut CVD synthetic stone (2a) were recorded with a Bruker X-band (9.5 GHz) spectrometer at room temperature. No single substitutional nitrogen could be detected (P1 EPR centre) with a detection limit of 0.014 ppm. At high powers a weak broad line close to g=2.0028 could be observed, placing an upper limit on the spin density of $1.6 \times 10^{15}$ $cm^{-3}$ (FIG. 10).

Example 3

A high temperature/high pressure synthetic type Ib diamond was grown in a high pressure press, and prepared using the method described in Example 1 to form a polished plate with low subsurface damage. The surface roughness at this stage was less than 1 nm $R_A$. The substrate was mounted on a tungsten substrate using a high temperature braze suitable for diamond. This was introduced into a reactor and a growth cycle commenced as described above, and more particularly:

1) The reactor was pre-fitted with point of use purifiers, reducing nitrogen levels in the incoming gas stream to below 80 ppb, as determined by the modified GC method described above.
2) The plasma process was initiated as an oxygen etch using 15/75/600 sccm of $O_2/Ar/H_2$ at a pressure of $333 \times 10^2$ Pa. This was followed by a H etch using 75/600 sccm $Ar/H_2$. Growth was initiated by the addition of the carbon source which in this instance was $CH_4$ flowing at 30 sccm The growth temperature at this stage was 780° C.
3) The atmosphere in which the growth took place contained less than 100 ppb nitrogen, as determined by the modified GC method described above.
4) On completion of the growth period, the substrate was removed from the reactor and the CVD diamond layer, 3.2 mm thick, was removed from the substrate.
5) The $\mu\tau$ product measured at 300 K using the Hecht relationship, as described above, was $3.3 \times 10^{-3}$ cm$^2$/V and $1.4 \times 10^{-3}$ cm$^2$/V for electrons and holes respectively, with an average $\mu\tau$ product of about $2.3 \times 10^{-3}$ cm$^2$/V.
6) A space charge limited time of flight experiment measured the electron mobility, $\mu_e$, to be 4000 cm$^2$/Vs at a sample temperature of 300 K.
7) A space charge limited time of flight experiment measured the hole mobility, $\mu_h$, to be 3800 cm$^2$/Vs at a sample temperature of 300 K.
8) SIMS measurements showed that there is no evidence for any single impurity present in concentrations above $5 \times 10^{16}$ cm$^{-3}$ (excluding H and its isotopes).

The measured resistivity was in excess of $2 \times 10^{13}$ Ohm cm at an applied voltage of 50 V/$\mu$m as measured at 300 K. The breakdown voltage exceeded 100 V/$\mu$m.

Example 4

The procedure set out in Example 3 was repeated to produce a further diamond layer. Various properties of this layer (obtained at 300 K) and the layers of Examples 1 to 3 are set out in the following table:

| Example | Thickness As Grown ($\mu$m) | Plate Thickness ($\mu$m) | CCD ($\mu$m) | $\mu_e\tau_e$ (cm$^2$/V) |
|---|---|---|---|---|
| Ex 1 | 3 400 | 420 | >400* | |
| Ex 2 | 2 750 | 435 | >400* | |
| Ex 3 | 3 200 | 500 | >480* | $3.3 \times 10^{-3}$ |
| Ex 4 | 2 100 | 280 | | $1.7 \times 10^{-3}$ |

| Example | $\mu_h\tau_h$ (cm$^2$/V) | $\mu_e$ (cm$^2$/Vs) | $\mu_h$ (cm$^2$/Vs) | Resistivity ($\Omega$ cm) at 50 V/$\mu$m |
|---|---|---|---|---|
| Ex 1 | | | | $>1 \times 10^{14}$ |
| Ex 2 | | | | $>1 \times 10^{14}$ |
| Ex 3 | $1.4 \times 10^{-3}$ | 4,000 | 3,800 | $>2 \times 10^{13}$ |
| Ex 4 | $0.72 \times 10^{-3}$ | | | |

*Minimum value, limited by sample thickness

FIGURE CAPTIONS

FIG. 1: Raman/photoluminescence spectrum of cut CVD synthetic stone (1a) recorded at 77 K with 514 nm argon ion laser excitation.

Figure 2:
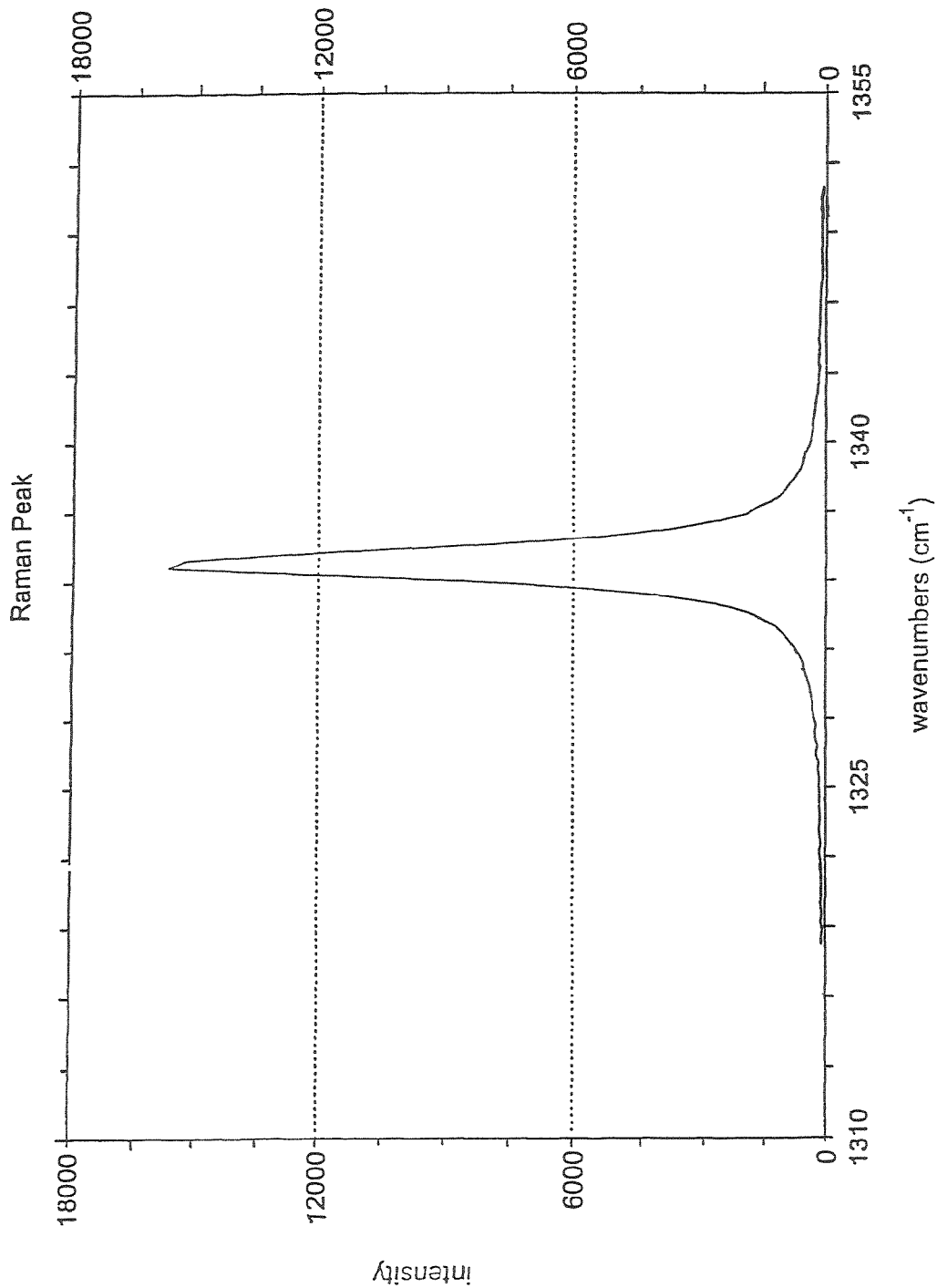

FIG. 2: Room temperature Raman spectrum of cut CVD synthetic stone (1a) (514 nm argon ion laser excitation) showing a Raman linewidth (FWHM) of 1.52 cm$^{-1}$.

Figure 3:
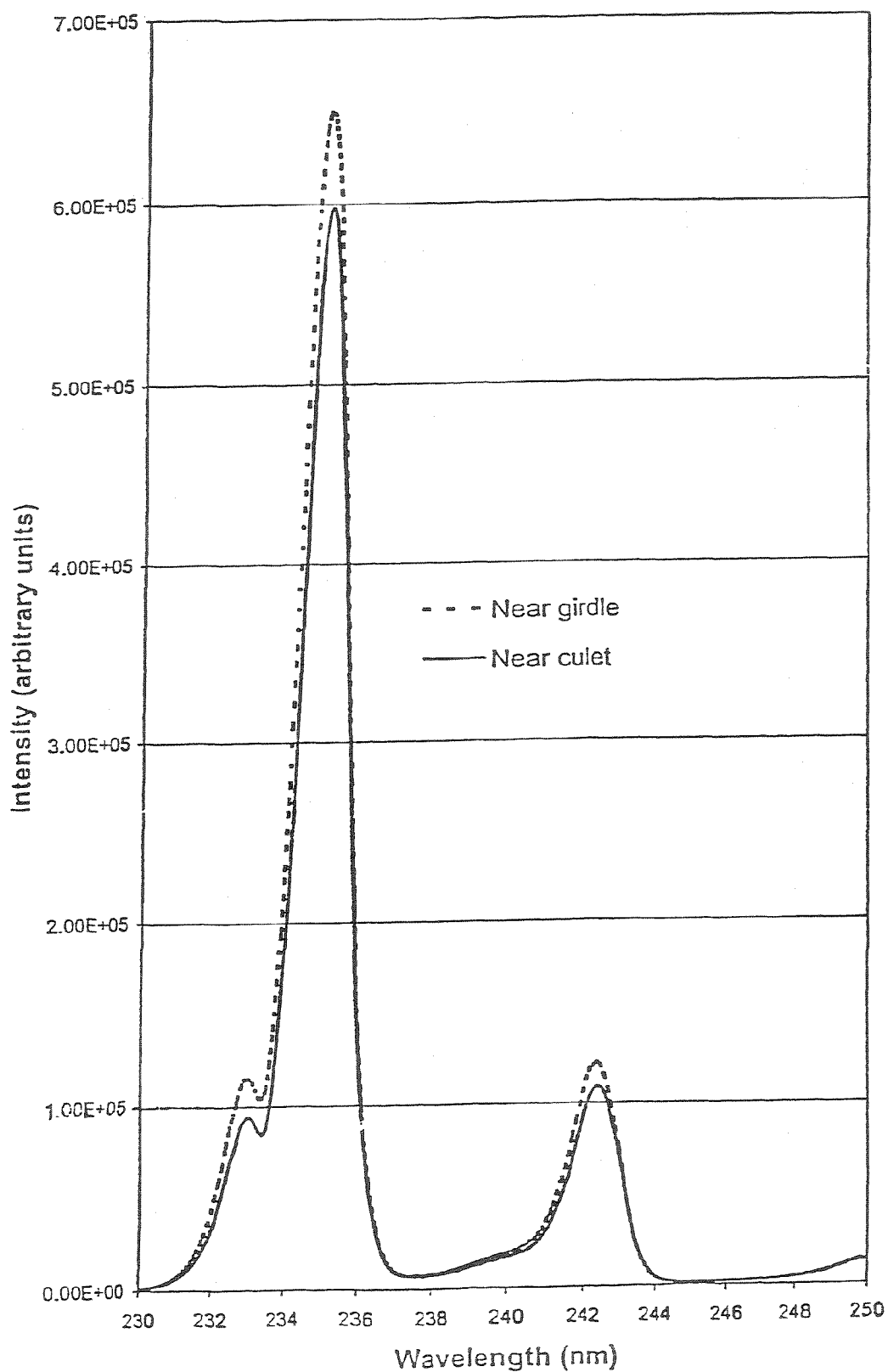

FIG. 3: Cathodoluminescence spectra recorded at 77 K from two locations on the cut CVD synthetic stone (1a) showing strong 235 nm free exciton emission.

Figure 4:
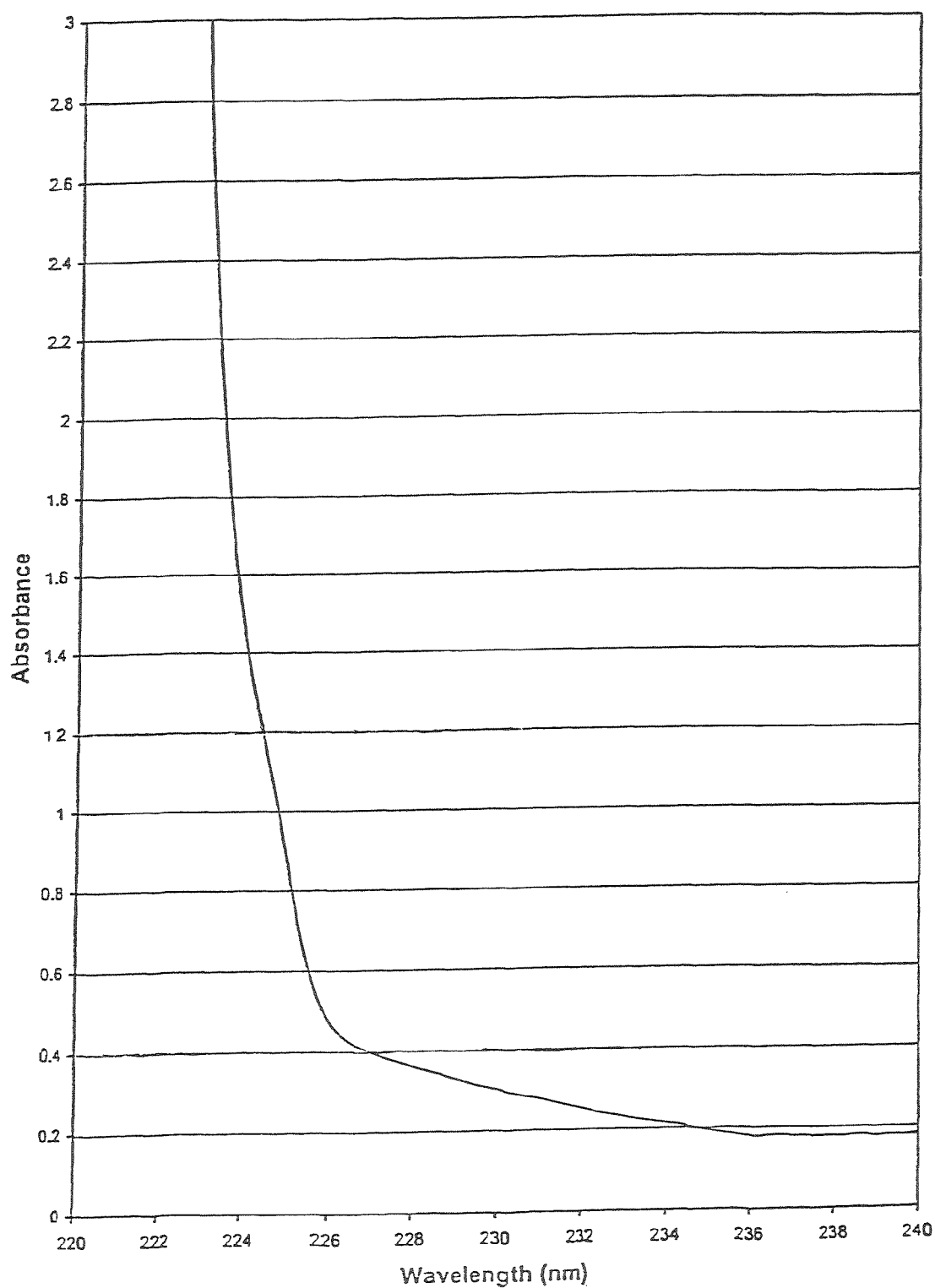
Figure 5:
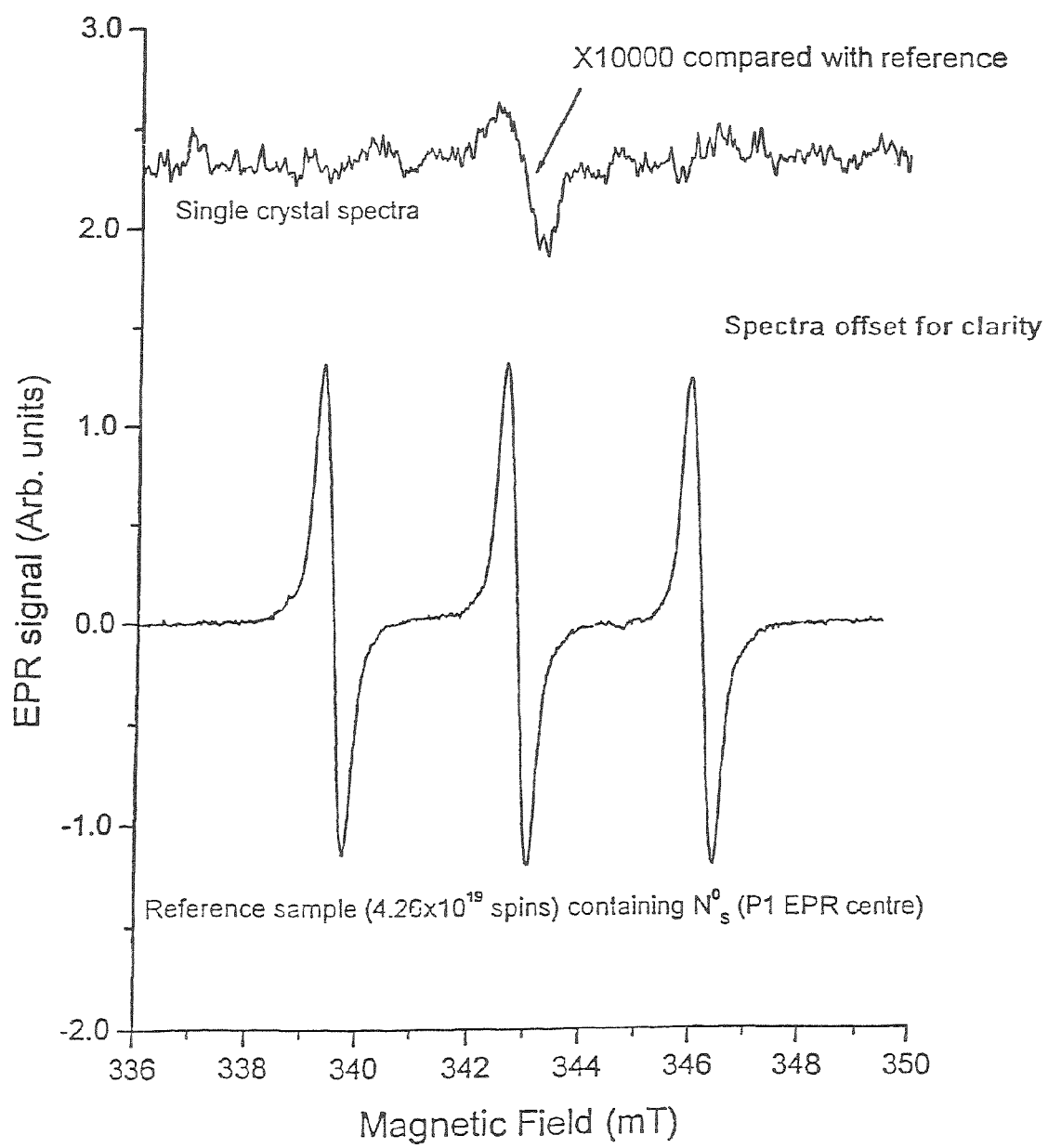

FIG. 4: UV absorption spectrum of optical plate (1b).

FIG. 5: X-band (9.5 GHz) EPR spectra taken at room temperature on cut CVD synthetic stone (1a), showing the absence of P1 and the weak broad line close to g=2.0028 which could be observed at high powers. Note that the scale of the plot for the sample is 10 000 times larger than that of the reference sample.

FIG. 6: Raman/photoluminescence spectrum of cut CVD synthetic stone (2a) recorded at 77 K with 514 nm argon ion laser excitation.

FIG. 7: Room temperature Raman spectrum of cut CVD synthetic stone (2a) (514 nm argon ion laser excitation) showing a Raman linewidth (FWHM) of 1.54 cm$^{-1}$.

FIG. 8: CL free exciton emission spectrum recorded at 77 K from cut CVD synthetic stone (2a).

FIG. 9: UV/visible absorption spectrum of optical plate (2b).

FIG. 10: Bruker X-band (9.5 GHz) EPR spectra of cut CVD synthetic stone (2a) taken at room temperature, showing the absence of P1 and the weak broad line close to g=2.0028 which could be observed at high powers. Note that the scale of the plot for the sample is 10 000 times larger than that of the reference sample.

The invention claimed is:

1. A layer of single crystal CVD diamond having a thickness of greater than 2 mm, wherein the layer has one or more of the following characteristics:
   (a) a level of any single impurity of not greater than 1 ppm and a total impurity content of not greater than 5 ppm where impurity excludes hydrogen and its isotopic forms; and
   (b) in electron paramagnetic resonance (EPR), a single substitutional nitrogen centre [N—C]$^0$ at a concentration<100 ppb.

2. A layer of single crystal CVD diamond according to claim 1 having a thickness of greater than 2.5 mm.

3. A layer of single crystal CVD diamond according to claim 1 having a thickness of greater than 3 mm.

4. A layer of single crystal CVD diamond according to claim 1, wherein the layer has both (a) and (b).

5. A layer of single crystal diamond CVD diamond material according to claim 1, wherein the layer has one or more of the following characteristics:
   (a) a photoluminescence line related to the (PL) cathodoluminescence (CL) line at 575 nm, measured at 77 K under 514 nm Ar ion laser excitation (nominally 300 mW incident beam), which has a peak height<1/25 of the diamond Raman peak at 1332 cm$^{-1}$;
   (b) a strong free exciton (FE) emission; the strength of free exciton emission excited by 193 nm ArF excimer laser at room temperature is such that the quantum yield for free exciton emission is at least 10$^{-5}$; and
   (c) in EPR, a spin density<1×10$^{17}$ cm$^{-3}$ at g=2.0028.

6. A layer of single crystal diamond CVD diamond material according to claim 4, wherein the layer has one or more of the following characteristics:
   (a) a photoluminescence line related to the (PL) cathodoluminescence (CL) line at 575 nm, measured at 77 K under 514 nm Ar ion laser excitation (nominally 300 mW incident beam), which has a peak height<1/25 of the diamond Raman peak at 1332 cm$^{-1}$;
   (b) a strong free exciton (FE) emission; the strength of free exciton emission excited by 193 nm ArF excimer laser at room temperature is such that the quantum yield for free exciton emission is at least $10^{-5}$; and (c) in EPR, a spin density $<1\times10^{17}$ cm$^{-3}$ at g=2.0028.

7. A layer of single crystal CVD diamond according to claim 5, wherein the layer has two or more of said characteristics.

8. A layer of single crystal CVD diamond according to claim 6, wherein the layer has two or more of said characteristics.

9. A layer of single crystal CVD diamond according to claim 5, wherein the layer has characteristic (a).

10. A layer of single crystal CVD diamond according to claim 5, wherein the layer has characteristic (b).

11. A layer of single crystal CVD diamond according to claim 5, wherein the layer has characteristic (c).

12. A layer of single crystal CVD diamond according to claim 6, wherein the layer has characteristic (a).

13. A layer of single crystal CVD diamond according to claim 6, wherein the layer has characteristic (b).

14. A layer of single crystal CVD diamond according to claim 6, wherein the layer has characteristic (c).

15. A layer of single crystal CVD diamond according to claim 7, wherein the layer has characteristic (a).

16. A layer of single crystal CVD diamond according to claim 7, wherein the layer has characteristic (b).

17. A layer of single crystal CVD diamond according to claim 7, wherein the layer has characteristic (c).

18. A layer of single crystal CVD diamond according to claim 8, wherein the layer has characteristic (a).

19. A layer of single crystal CVD diamond according to claim 8, wherein the layer has characteristic (b).

20. A layer of single crystal CVD diamond according to claim 8, wherein the layer has characteristic (c).

21. A layer of single crystal CVD diamond according to claim 5, having a thickness of greater than 2.5 mm.

22. A layer of single crystal CVD diamond according to claim 5, having a thickness of greater than 3 mm.

23. A layer of single crystal diamond according to claim 5, attached, at least in part, to a substrate.

24. An article comprising a layer of single crystal CVD diamond according to claim 1 attached, at least in part, to a substrate.

25. A diamond in the form of a gemstone produced from a layer of single crystal CVD diamond according to claim 1.

26. A CVD diamond produced in the form of a gemstone from a layer of single crystal CVD diamond according to claim 1 and which has three orthogonal dimensions greater than 2 mm, where at least one axis lies either along the <100>crystal direction or along the principle symmetry axis of the stone.

27. A method of producing a layer of single crystal CVD diamond according to claim 1 comprising providing a diamond substrate having a surface which is substantially free of crystal defects, providing a source gas, dissociating the source gas and allowing homoepitaxial diamond growth on the surface which is substantially free of crystal defects in an atmosphere which contains less than 300 parts per billion nitrogen to produce a layer of single crystal CVD diamond having a thickness of greater than 2 mm.

28. A method according to claim 27 wherein the substrate is a low birefringence type Ia or IIb natural, or a Ib or IIa high pressure/high temperature synthetic diamond.

29. A method according to claim 27 wherein the substrate is a CVD synthesized single crystal diamond.

30. A method according to claim 27 wherein the surface on which diamond growth occurs has a density of surface etch features related to defects below $5\times10^3$/mm$^2$.

31. A method according to claim 27 wherein the surface on which diamond growth occurs has a density of surface etch features related to defects below $10^2$/mm$^2$.

32. A method according to claim 27 wherein the surface on which the diamond growth occurs is subjected to a plasma etch to minimize surface damage of the surface prior to diamond growth.

33. A method according to claim 32 wherein the plasma etch is an in situ etch.

34. A method according to claim 32 wherein the plasma etch is an oxygen etch using an etching gas containing hydrogen and oxygen.

35. A method according to claim 34, wherein the oxygen etch conditions are a pressure of 50 to 450×10$^2$ Pa, an etching gas containing oxygen content of 1 to 4%, an argon content of up to 30% and the balance hydrogen, all percentages being by volume, a substrate temperature of 600 to 1100° C., and an etch duration of 3 to 60 minutes.

36. A method according to claim 32, wherein the plasma etch is a hydrogen etch.

37. A method according to claim 36, wherein the hydrogen etch conditions are a pressure of 50 to 450×10$^2$ Pa, an etching gas containing hydrogen and up to 30% by volume argon, a substrate temperature of 600 to 1100° C., and an etch duration of 3 to 60 minutes.

38. A method according to claim 32, wherein the surface on which the diamond growth occurs is subjected to both an oxygen etch and a hydrogen etch to minimize damage to the surface prior to diamond growth.

39. A method according to claim 38, wherein the oxygen etch is followed by a hydrogen etch.

40. A method according to claim 32, wherein the surface $R_A$ of the surface on which the diamond growth occurs is less than 10 nanometers prior to that surface being subjected to the plasma etching.

41. A method according to claim 27, wherein the surface on which the diamond growth occurs is a {100}, {110}, {113} or {111} surface.

42. The method according to claim 27, wherein the dissociation of the source gas occurs using microwave energy.

43. The method according to claim 27, wherein said layer has a thickness of greater than 2 mm.

44. An article comprising a layer of single crystal CVD diamond according to claim 5, attached, at least in part, to a diamond substrate.

45. A diamond in the form of a gemstone produced from a layer of single crystal CVD diamond according to claim 5.

46. A diamond in the form of a gemstone produced from a layer of single crystal CVD diamond according to claim 6.

47. A CVD diamond produced in the form of a gemstone from a layer of single crystal CVD diamond according to claim 5, and having three orthogonal dimensions greater than 2 mm, where at least one axis lies along the <100>crystal direction or along the principle symmetry axis of the stone.

48. A CVD diamond according to claim 47, and having three orthogonal dimensions greater than 2.5 mm, where at least one axis lies either along the <100>crystal direction or along the principle symmetry axis of the stone.

49. A CVD diamond according to claim 47, and by having three orthogonal dimensions greater than 3 mm, where at least one axis lies either along the <100> crystal direction or along the principle symmetry axis of the stone.

* * * * *

UNITED STATES PATENT AND TRADEMARK OFFICE
CERTIFICATE OF CORRECTION

PATENT NO. : 7,887,628 B2  
APPLICATION NO. : 11/681840  
DATED : February 15, 2011  
INVENTOR(S) : Geoffrey A. Scarsbrook et al.

Page 1 of 1

It is certified that error appears in the above-identified patent and that said Letters Patent is hereby corrected as shown below:

On the title page, Item (75), the eighth inventor's name is incorrect. Item (75) should read:

-- (75) Inventors: Geoffrey Alan Scarsbrook, Ascot (GB); Philip Maurice Martineau, Littlewick Green (GB); Barbel Susanne Charlotte Dorn, Bracknell (GB); Michael Andrew Cooper, Wokingham (GB); John Lloyd Collins, London (GB); Andrew John Whitehead, Surrey (GB); Daniel James Twitchen, Sunningdale (GB); Ricardo Simon Sussmann, Reading (GB) --

Signed and Sealed this  
Fifth Day of April, 2011

David J. Kappos  
*Director of the United States Patent and Trademark Office*